United States Patent
Mitsui

(10) Patent No.: US 8,090,192 B2
(45) Date of Patent: Jan. 3, 2012

(54) PATTERN MISALIGNMENT MEASUREMENT METHOD, PROGRAM, AND SEMICONDUCTOR DEVICE MANUFACTURING METHOD

(75) Inventor: Tadashi Mitsui, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 976 days.

(21) Appl. No.: 11/785,782

(22) Filed: Apr. 20, 2007

(65) Prior Publication Data

US 2007/0248258 A1 Oct. 25, 2007

(30) Foreign Application Priority Data

Apr. 21, 2006 (JP) ................................. 2006-117931

(51) Int. Cl.
*G06K 9/00* (2006.01)
(52) U.S. Cl. .......................... 382/151; 382/284; 382/145
(58) Field of Classification Search .................. 382/284, 382/145, 151
See application file for complete search history.

(56) References Cited

U.S. PATENT DOCUMENTS

| | | | | |
|---|---|---|---|---|
| 5,153,444 A * | 10/1992 | Maeda et al. | ............ | 250/559.05 |
| 5,563,702 A * | 10/1996 | Emery et al. | ..................... | 356/73 |
| 5,695,894 A * | 12/1997 | Clube | .............................. | 430/1 |
| 5,787,190 A * | 7/1998 | Peng et al. | ..................... | 382/145 |
| 6,068,954 A * | 5/2000 | David | ............................. | 430/22 |
| 6,128,403 A * | 10/2000 | Ozaki | ........................... | 382/145 |
| 6,178,257 B1 * | 1/2001 | Alumot et al. | ................. | 382/145 |
| 6,330,353 B1 * | 12/2001 | Lai et al. | ........................ | 382/147 |
| 6,757,875 B2 | 6/2004 | Matsuoka | | |
| 6,952,491 B2 * | 10/2005 | Alumot et al. | ................. | 382/149 |
| 7,388,979 B2 * | 6/2008 | Sakai et al. | .................... | 382/149 |
| 7,664,309 B2 * | 2/2010 | Horie et al. | ..................... | 382/144 |
| 2002/0094120 A1 * | 7/2002 | Hiroi et al. | ..................... | 382/149 |
| 2004/0083445 A1 * | 4/2004 | Mukai et al. | .................... | 716/19 |
| 2004/0096092 A1 * | 5/2004 | Ikeda | .............................. | 382/141 |
| 2005/0147287 A1 * | 7/2005 | Sakai et al. | .................... | 382/141 |
| 2007/0020880 A1 * | 1/2007 | Mukai et al. | ................... | 438/424 |
| 2007/0230825 A1 * | 10/2007 | Hasegawa et al. | ............ | 382/294 |

FOREIGN PATENT DOCUMENTS

| | | |
|---|---|---|
| JP | 8-181053 | 7/1996 |
| JP | 2003-188074 | 7/2003 |
| JP | 2004-78659 | 3/2004 |
| JP | 2006-275952 | 10/2006 |

OTHER PUBLICATIONS

Notification of Reasons for Rejection issued by the Japanese Patent Office on Dec. 24, 2010, for Japanese Patent Application No. 2006-117931, and English-language translation thereof.

* cited by examiner

*Primary Examiner* — Wesley Tucker
*Assistant Examiner* — Aklilu Woldemariam
(74) *Attorney, Agent, or Firm* — Finnegan, Henderson, Farabow, Garrett & Dunner, L.L.P.

(57) ABSTRACT

A pattern misalignment measurement method includes acquiring an inspection image of a composite pattern formed by superposing a plurality of kinds of element patterns on each other, acquiring reference images of at least two kinds of element patterns from reference images which are images of reference patterns of the plurality of kinds of element patterns, performing first matching of each of the acquired reference images with the inspection image, and outputting misalignment between the element patterns in the composite pattern on the basis of the result of the first matching.

18 Claims, 9 Drawing Sheets

PATTERN MISALIGNMENT MEASUREMENT METHOD, PROGRAM, AND SEMICONDUCTOR DEVICE MANUFACTURING METHOD

CROSS REFERENCE TO RELATED APPLICATION

This application claims benefit of priority under 35USC §119 to Japanese patent application No. 2006-117931, filed on Apr. 21, 2006, the contents of which are incorporated by reference herein.

BACKGROUND OF THE INVENTION

1. Field of the Invention

The present invention relates to a pattern misalignment measurement method, a program, and a semiconductor device manufacturing method.

2. Related Background Art

To take a semiconductor device as an example, an alignment technique in a photolithographic process is important in the manufacture of the semiconductor device, and a misalignment inspection process for inspecting an alignment result is an essential technique together with a critical dimension (CD) measurement process to manufacture a micro unit with a high yield. A method using an optical inspection apparatus has heretofore been used for a misalignment inspection. In addition to this method, another method has been recently proposed which uses an electron beam (EB) with a good resolution to achieve the misalignment inspection with higher accuracy.

A common point between the inspection using the electron beam and the method using the optical inspection apparatus is that an SEM image is acquired by use of an inspection apparatus which uses a scanning electron microscope such as a critical dimension scanning electron microscope (CDSEM), and the obtained image is analyzed to obtain a desired numerical value.

However, in both the optical inspection apparatus and the EB inspection apparatus, the above-mentioned conventional technique requires the use of a special pattern structure (inspection mark) for misalignment measurement. Specifically, this has led to the following problems:
1. Costs are required to form the inspection mark.
2. The misalignment measurement in the center of a device is impossible because the inspection mark can only be disposed in peripheral parts of the device.
3. The misalignment measurements have to be carried out independently in an X direction and a Y direction, and much time is therefore taken for the measurements.

SUMMARY OF THE INVENTION

According to a first aspect of the present invention, there is provided a pattern misalignment measurement method comprising:
acquiring an inspection image of a composite pattern formed by superposing a plurality of kinds of element patterns on each other;
acquiring reference images of at least two kinds of element patterns from reference images which are images of reference patterns of the plurality of kinds of element patterns;
performing first matching of each of the acquired reference images with the inspection image; and
outputting misalignment between the element patterns in the composite pattern on the basis of the result of the first matching.

According to a second aspect of the present invention, there is provided a program which is contained in a computer-readable medium and which causes a computer to execute a pattern misalignment measurement method, the method comprising:
acquiring an inspection image of a composite pattern formed by superposing a plurality of kinds of element patterns on each other;
acquiring reference images of at least two kinds of element patterns from reference images which are images of reference patterns of the plurality of kinds of element patterns;
performing first matching of each of the acquired reference images with the inspection image; and
outputting misalignment between the element patterns in the composite pattern on the basis of the result of the first matching.

According to a third aspect of the present invention, there is provided a semiconductor device manufacturing method which comprises executing a process of manufacturing a semiconductor device on a semiconductor substrate judged as nondefective by measuring misalignment of patterns formed on the semiconductor substrate, a method of measuring the misalignment including:
acquiring an inspection image of a composite pattern formed by superposing a plurality of kinds of element patterns on each other;
acquiring reference images of at least two kinds of element patterns from reference images which are images of reference patterns of the plurality of kinds of element patterns;
performing first matching of each of the acquired reference images with the inspection image; and
outputting misalignment between the element patterns in the composite pattern on the basis of the result of the first matching.

DETAILED DESCRIPTION OF THE INVENTION

Several embodiments of the present invention will hereinafter be described with reference to the drawings.

There will be described below, as a specific example, measurement of misalignment of micropatterns formed in semiconductor device manufacturing processes such as a photolithographic process and an etching process. However, it should be noted that the present invention is not limited thereto and is applicable to pattern misalignment measurement in general in various other industrial fields. It should also be noted in the present application that the "superposition" of patterns is not in the least limited to the case of a stack structure, and, for example, the present invention also includes a case where a plurality of kinds of element patterns are formed in the same layer using resist patterns having different shapes as far as the semiconductor device manufacturing processes are concerned. In addition, while a case will be taken as an example in the following embodiments where the superposition is measured using a top-down SEM image acquired by a CDSEM, but the present invention is not limited to this, and the present invention can also be applied to images acquired by any other units such as an optical image acquiring unit. However, the use of an SEM image is preferable at present because a pattern image has to be acquired at a higher magnification in order to highly accurately measure the misalignment of the micropatterns of a semiconductor.

(1) First Embodiment

Figure 1:
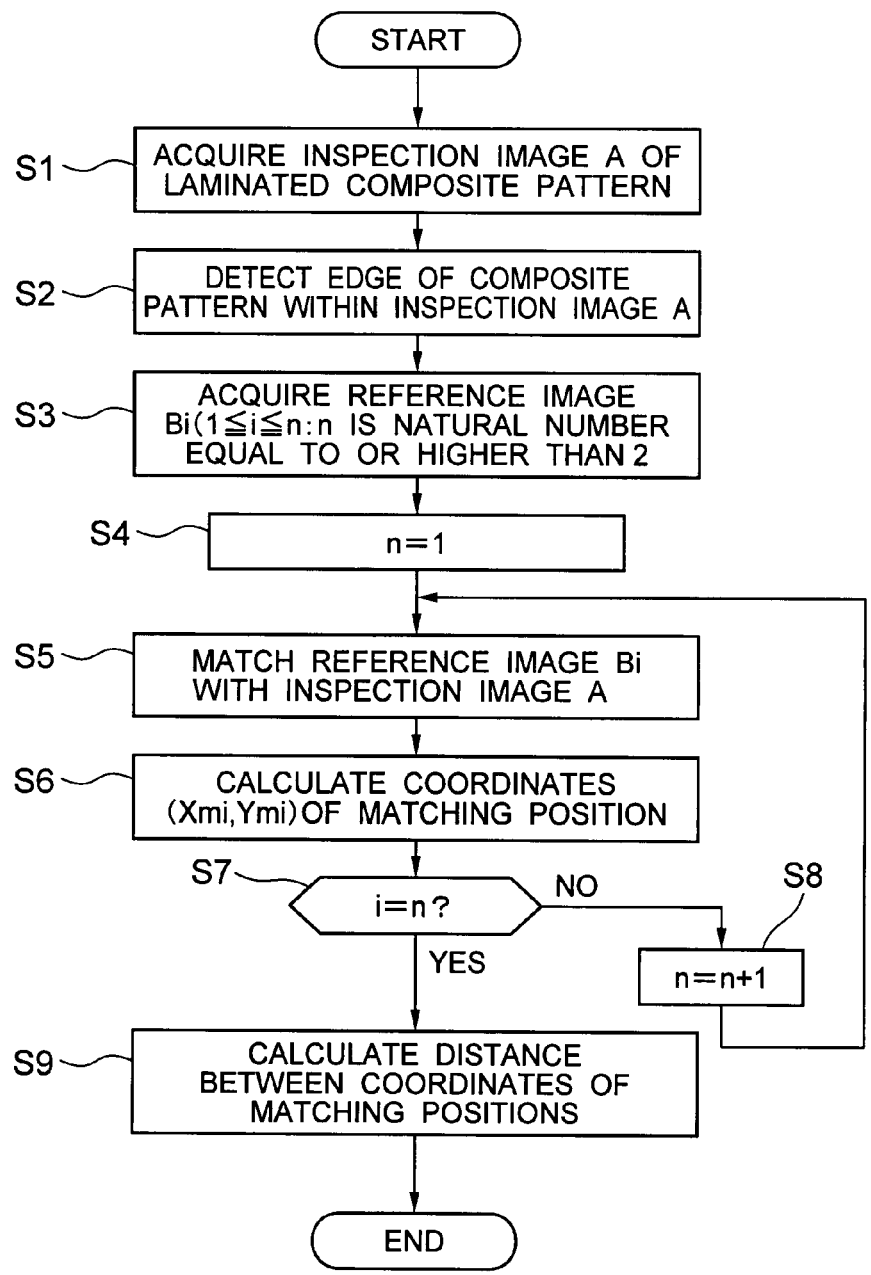
FIG. 1 is a flowchart showing a schematic procedure of a pattern misalignment measurement method according to a first embodiment of the present invention.
Figure 2:
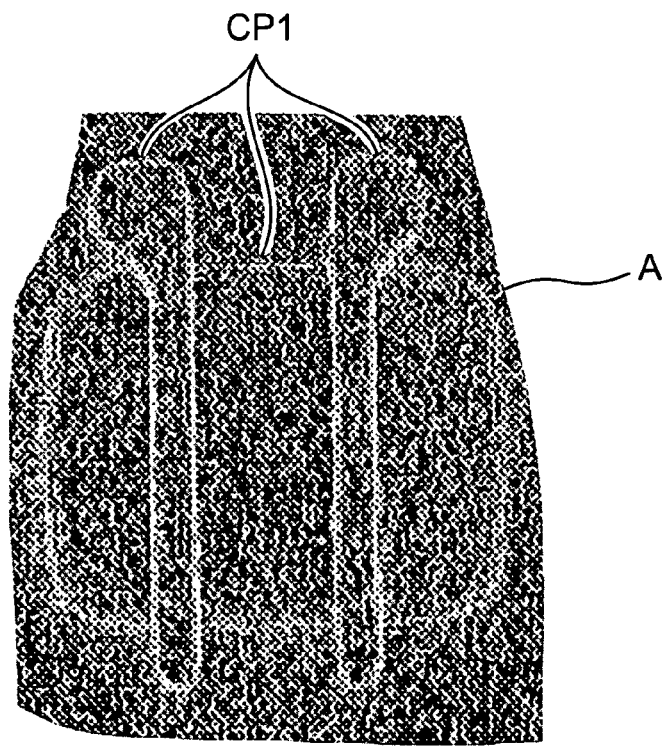
FIG. 2 is a diagram showing an inspection image of one example of a composite pattern having a stack structure.

A first embodiment of the present invention will be described with reference to FIG. 1 to FIG. 9. In the present embodiment, a case will be described as an example where misalignment between single-layer patterns constituting a stack formed on a semiconductor substrate is measured using design data for the stack. The drawings except for FIG. 1 are shown in top-down view in which patterns are looked down from above. An actual pattern generally has a height in a direction vertical to the surface of the substrate. However, in a pattern measurement method of the present embodiment, misalignment is measured on the basis of an edge detected from an SEM image in the top-down view as shown in FIG. 2, so that any structure is acceptable in an actual height direction.

FIG. 1 is a flowchart showing a schematic procedure of a pattern misalignment measurement method according to the present embodiment.

Figure 3:
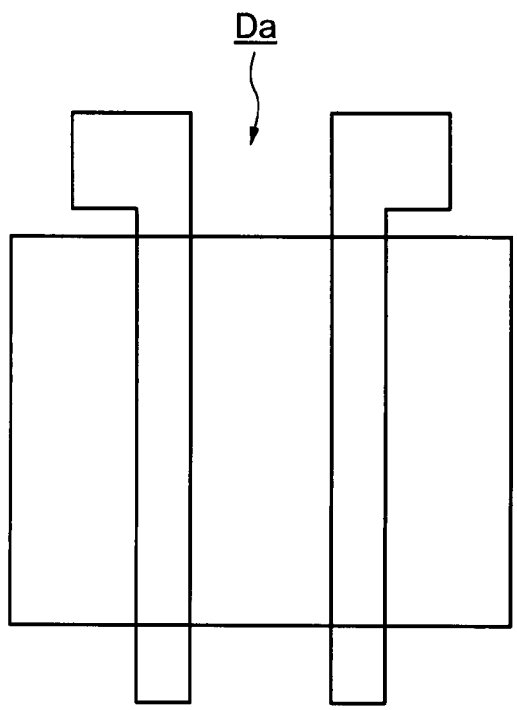
FIG. 3 is a linear image of design data for the composite pattern shown in FIG. 2.

First, an image A of a laminated composite pattern targeted for misalignment measurement is acquired (step S1). An inspection image of one example of the composite pattern having a stack structure is shown in FIG. 2. FIG. 3 is an image of design data for a composite pattern CP1 shown in FIG. 2. Since the design data is generally described in a format such as GDS, the design data is expanded as a linear image in FIG. 3. Design data Da shown in FIG. 3 is the superposition of design data (see FIGS. 5 and 6) for single-layer patterns EP1 and EP2 (see FIG. 4). It is to be noted that, in the present embodiment, the single-layer patterns correspond to, for example, element patterns.

Figure 4:
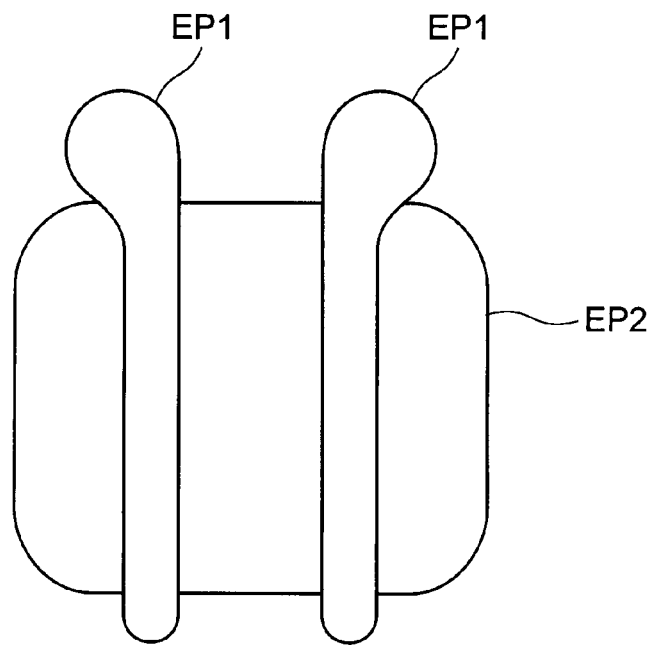
FIG. 4 is a diagram showing the edge of the composite pattern detected from the inspection image shown in FIG. 2.

Next, the edge of the composite pattern within the inspection image A is detected (FIG. 1, step S2). The present embodiment uses a method which has been improved on the basis of a Canny filter. An edge thus obtained is shown in FIG. 4. The detection of the edge is not limited to the above-mentioned method, and any existing method may be used. However, as the whole edge of the pattern has to be detected over the entire range of the image, methods by processing through filters including Canny, Sobel, etc. are suitable.

Then, reference images Bi ($1 \leq i \leq n$: n is a natural number equal to or higher than 2) of the element patterns constituting the composite pattern CP1 are acquired (step S3). In the present embodiment, a linear image of design data for a reference pattern RP1 shown in FIG. 5 is a reference image B1 (i=1) of the element pattern EP1, and a linear image of design data for a reference pattern RP2 shown in FIG. 6 is a reference image B2 (i=2) of the element pattern EP2 (n=2).

Subsequently, the reference images Bi are matched with the inspection image A (FIG. 1, steps S4 to S8). First, assuming that n=1 (step S4), the reference image B1 is matched with the inspection image A (step S5). In the present embodiment, a matching (hereinafter, referred to as distance field matching) method proposed in Japanese Patent Laid Open (kokai) 2006-275952 is used. By this citation, the contents of Japanese Patent Laid Open (kokai) 2006-275952 are incorporated in the specification of the present application. Moreover, an arrangement-converted image generated in the distance field matching is hereinafter referred to as a "distance field".

Figure 5:
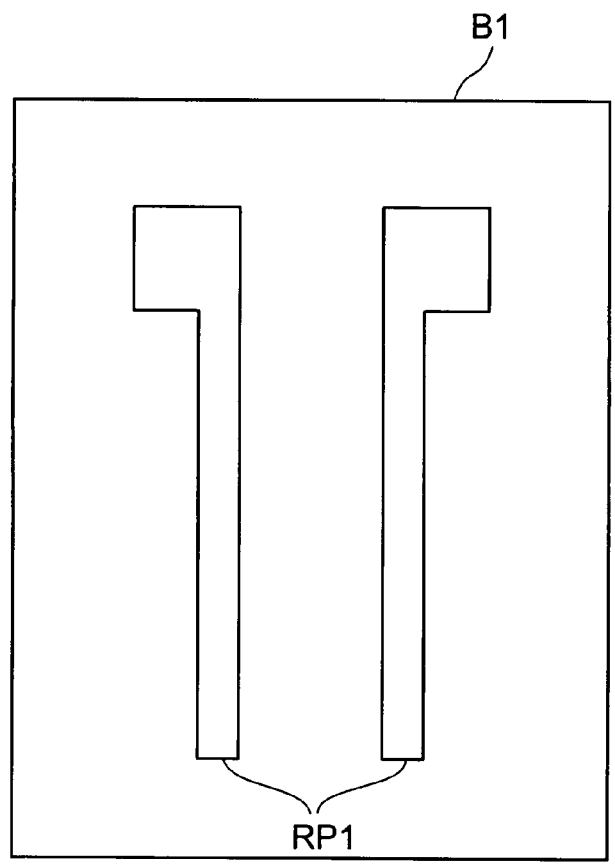
FIG. 5 is a linear image of design data for one of single-layer patterns constituting the composite pattern shown in FIG. 2.
Figure 6:
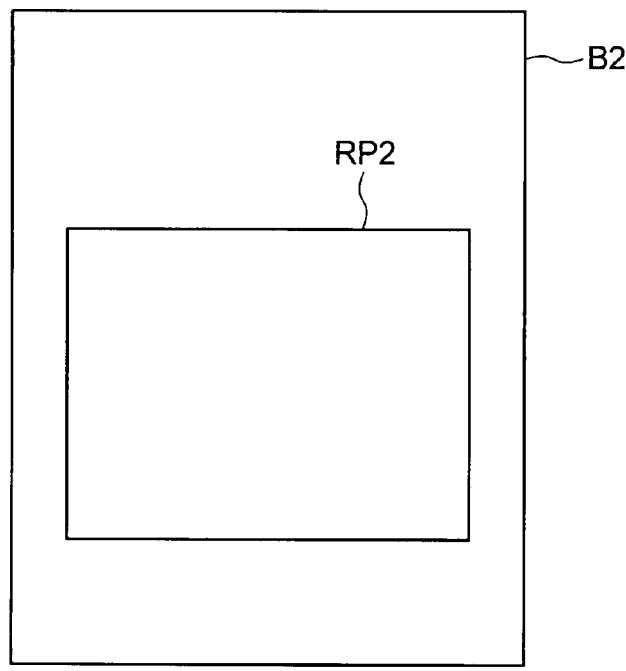
FIG. 6 is a linear image of design data for another one of the single-layer patterns constituting the composite pattern shown in FIG. 2.
Figure 7:
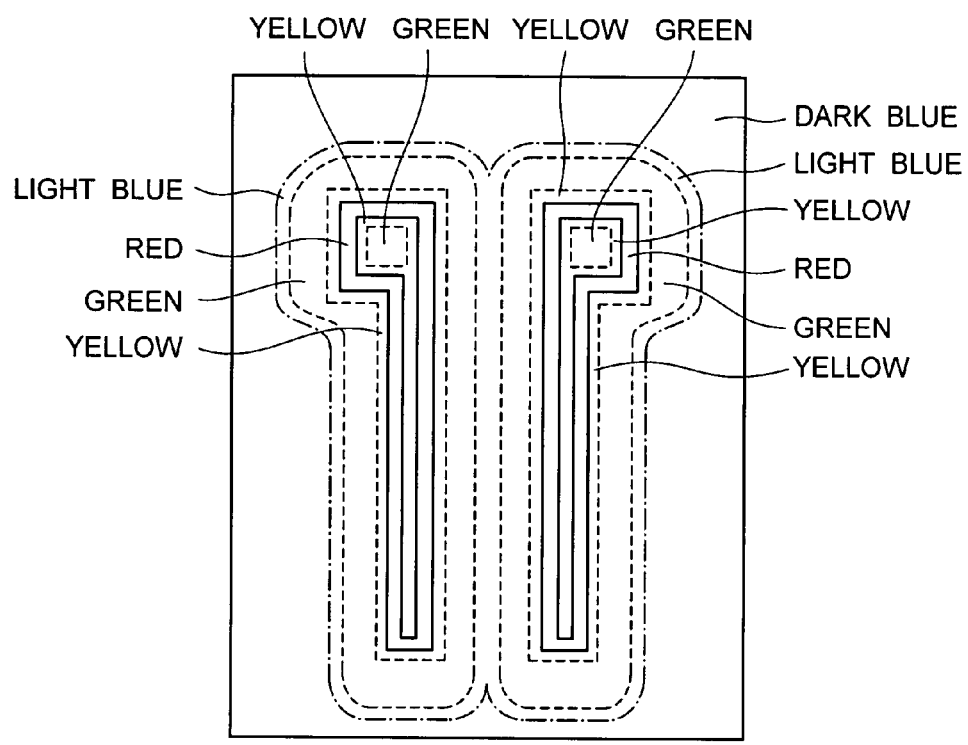
FIG. 7 is a diagram showing a specific example of a distance field created from the design data for the single-layer pattern shown in FIG. 5.
Figure 8:
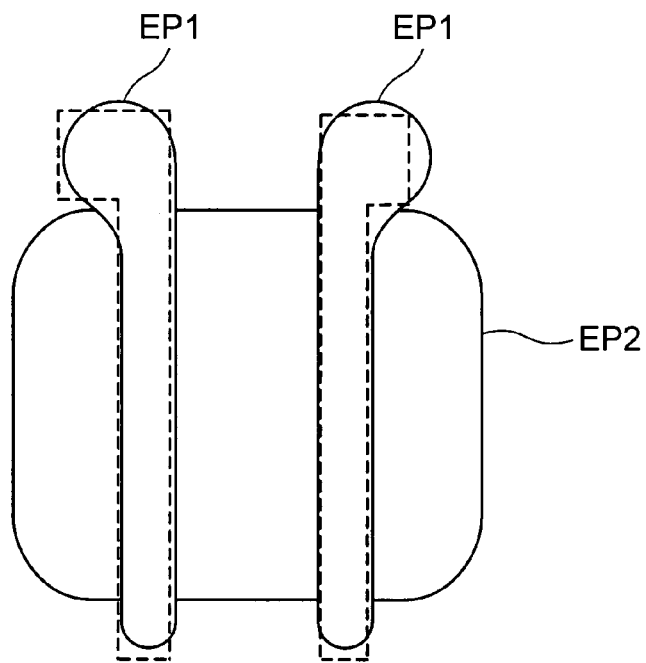
FIG. 8 is a diagram showing the result of matching the inspection image shown in FIG. 2 with the reference image shown in FIG. 5.

To more specifically explain the distance field matching, a distance field is created as shown in FIG. 7 from the design data for the reference pattern RP1 of the element pattern EP1 shown in FIG. 5, and a convolution operation with edge data for the reference pattern RP1 is performed at a position relative to this distance field. This operation provides values of the distance fields corresponding to individual edge coordinates constituting the edge data for the reference pattern RP1. These values correspond to the distances from the edge of the reference pattern RP1, and these values are totaled over all the edge points, and a resulting value is employed as a matching parameter. As a result, a relative position providing a maximum integration value can be identified as the position of a matching point (FIG. 1, step S6). The result of this matching of the image A with the reference image B1 is shown in FIG. 8. In FIG. 8, the edge of the composite pattern CP1 is indicated by full lines, and the pattern edge of the reference design data is indicated by broken lines. Coordinates of the matching position are calculated at (Xm1, Ym1)=(252.5, 221.5) (unit: pixel).

Figure 9:
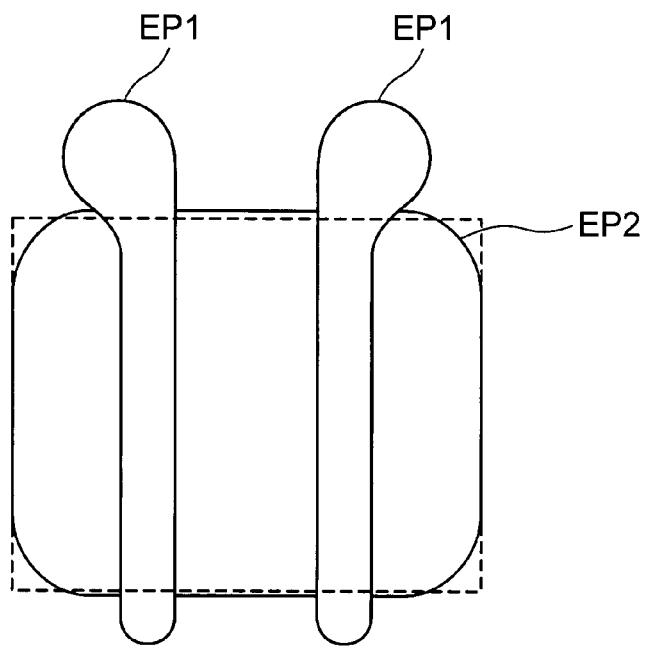
FIG. 9 is a diagram showing the result of matching the inspection image shown in FIG. 2 with the reference image shown in FIG. 6.

In the same manner, the reference image B2 is matched with the image A. More specifically, since i<n (=2) (step S7), n is incremented in such a manner that n=n+1 (step S8), thus repeating the procedure in steps S5 and S6. The result is shown in FIG. 9. Coordinates of the matching position are calculated at (Xm2, Ym2)=(255.5, 226.5) (unit: pixel).

Finally, a distance (ΔX, ΔY) between the coordinates of the obtained n (two in the present embodiment) matching positions is found. In the present embodiment, obtained results are as follows: ΔX=3.0 [pixel] and ΔY=5.0 [pixel]. Both of these values should normally be 0 if the patterns are precisely superposed on each other, and these values are the values of the misalignment of the single-layer patterns EP1 and EP2 manufactured in accordance with the design data in FIGS. 5 and 6, regarding the composite pattern CP1 in FIG. 2.

Thus, according to the present embodiment, the misalignment at an arbitrary position can be measured in a short time and with high accuracy without needing any inspection mark.

In addition, the edge of the composite pattern is detected (FIG. 1, step S2) before the matching processing (FIG. 1, step S5) in the present embodiment. This is because the matching is carried out using the distance field. The order of steps S1 to S3 and S5 is not limited to the order shown in FIG. 1, and this order can be freely replaced with any order depending on the matching method, etc. The matching method is not limited to the distance field matching, and correlative matching or any other techniques can be used.

(2) Second Embodiment

A pattern misalignment measurement method according to the present embodiment enhances the accuracy of measurement by the addition of a procedure of considering the importance of an edge to the first embodiment described above.

Figure 10:
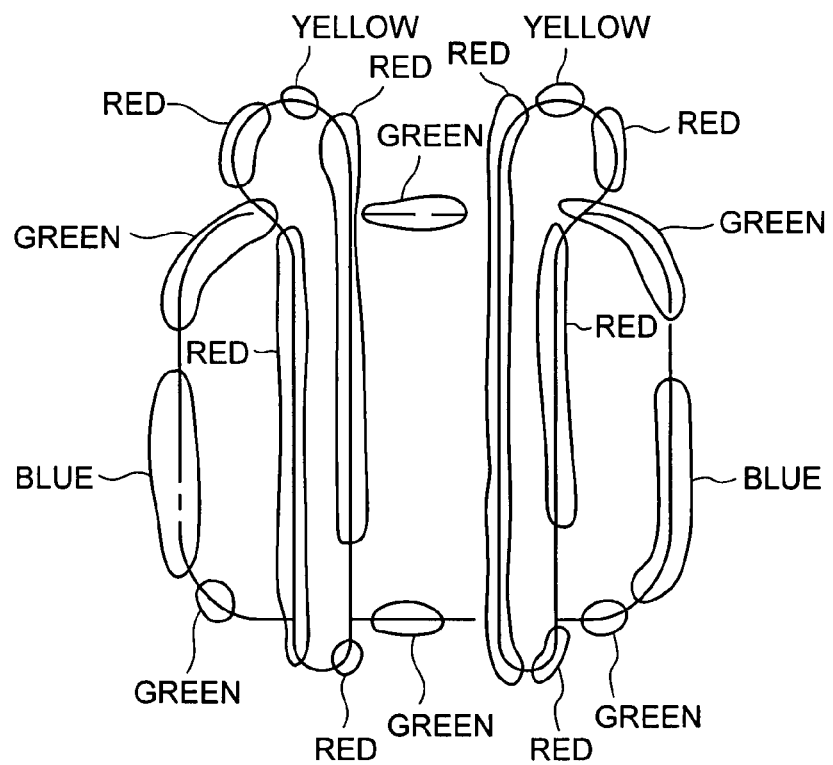
FIG. 10 is a schematic diagram of a color display wherein intrinsic values provided to edge points of the composite pattern shown in FIG. 4 are allocated to index colors and displayed.

In matching using a distance field, intrinsic values, here, values of distances from the edge of a reference pattern can be provided to edge points of an inspection image after matching processing. These intrinsic values can be allocated to, for example, 256 index colors and displayed on a display. A schematic diagram of such color display is shown in FIG. 10. In FIG. 10, portions indicated by "red" indicate that the distance from the edge is small, and the distance from the edge is greater in parts closer to portions indicated by "blue". From such color display, it can be understood that the edges of the portions indicated by "red" are of higher importance in deciding a matching position. In addition, details of the color display are not drawn in FIG. 10 because FIG. 10 is a schematic diagram. However, actual color display has gradation, so that there are gradual changes in color, for example, in a part between the portion indicated by "red" and the portion indicated by "blue".

The influence of the edge of low importance needs to be reduced to the minimum in order to perform more accurate matching processing. Thus, a certain threshold value is set for the above-mentioned intrinsic values, and the edge points having the intrinsic values equal to or lower than the threshold value are erased from the edge data, such that the accuracy of measurement can be further increased. The threshold value varies depending on the definition of the distance field. In the present embodiment, since 12-bit values are provided on the edge points as the intrinsic values, for example, a value of 3000 corresponding to colors between light blue and yellowish green out of 256 colors may be set as the threshold value. When the edge points having the intrinsic values equal to or higher than 3000 are erased from the edge shown in FIG. 10, an edge image shown in FIG. 11 can be obtained.

Figure 11:
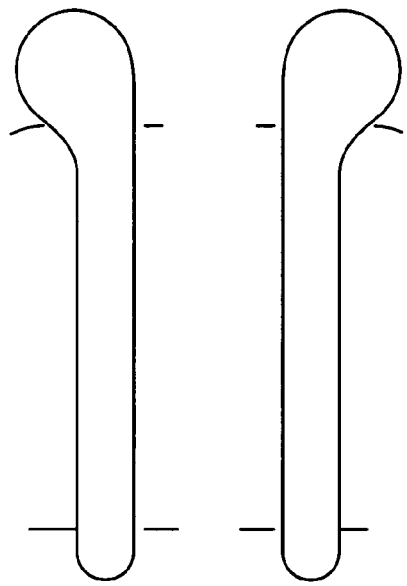
FIG. 11 shows an edge image obtained by erasing edge points of low importance from the edge points shown in FIG. 10.

If the matching processing using the distance field is again performed using the edge data corresponding to FIG. 11, a more accurate matching result can be obtained. It is to be noted that, in the present embodiment, the rematching using the distance field corresponds to, for example, matching in accordance with a second matching procedure.

Figure 12:
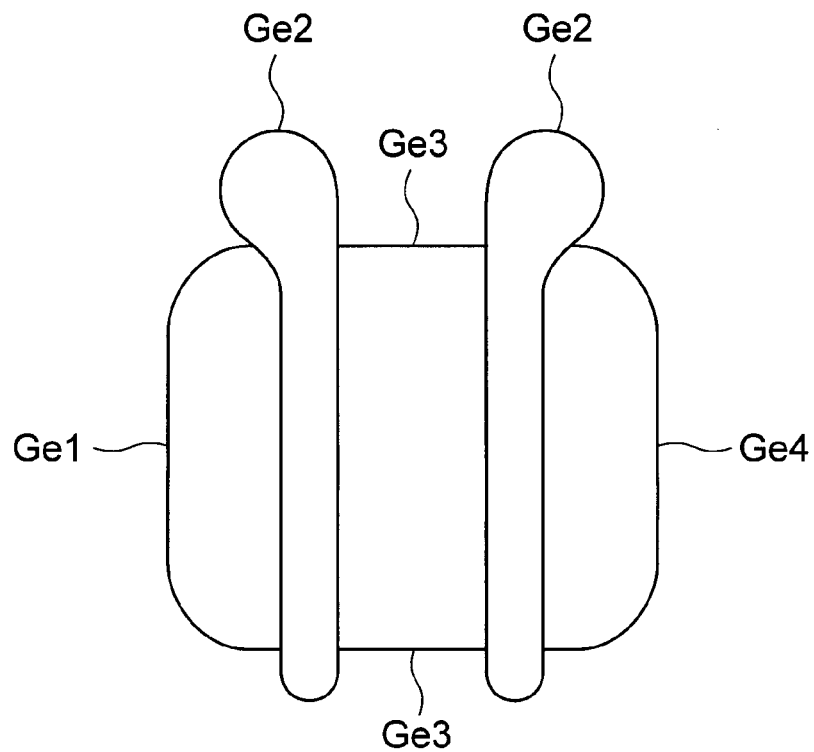
FIG. 12 shows one example of dividing the edge points shown in FIG. 10 into a plurality of edge groups by component.
Figure 13:
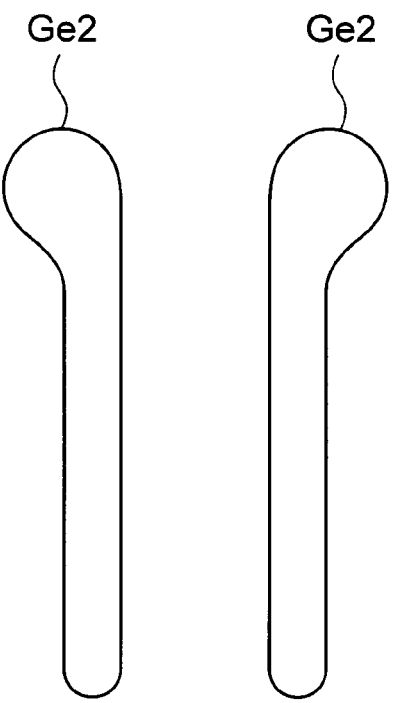
FIG. 13 is a diagram showing an example in which edge groups of low importance are erased from the edge groups shown in FIG. 12.

In the above explanation, the intrinsic values are provided to the respective edge points, and the edge points having the intrinsic values equal to or lower than the threshold value are erased from the edge data, such that the influence of the edge of low importance is avoided. Instead of judging the importance of such individual edge points, the edge of the inspection image may be divided into a plurality of edge groups by component, and the importance may be calculated for each edge group. In this case, the edge groups are classified using a threshold value, and the edge groups classified as low importance are erased. FIG. 12 shows a specific example of grouping, and FIG. 13 shows an example in which the edge groups of low importance are erased. In the example shown in FIG. 13, edge groups Ge1, Ge3 and Ge4 judged as low in importance are erased out of the edge groups Ge1 to Ge4 in FIG. 12. When the importance is calculated for each edge group in this manner, no isolated point remains around the edge groups of high importance, as apparent from contrast between FIG. 11 and FIG. 13. Thus, the accuracy of measurement can be further increased.

Here, another method can be used in which the judgment of the level of importance is associated with the magnitude of distance in the distance field. One example of which will be described with reference to FIGS. 14 to 19.

Figure 14:
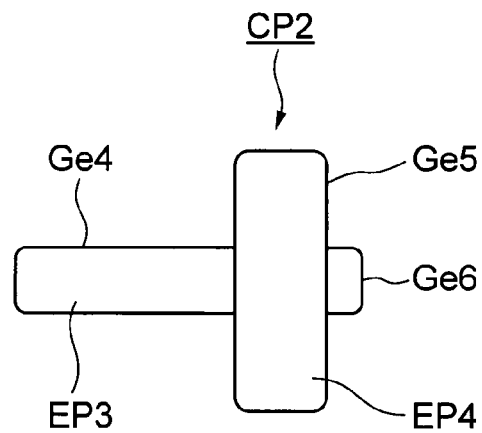
FIG. 14 is a schematic diagram showing an inspection image of another example of a composite pattern having a stack structure.
Figure 15:
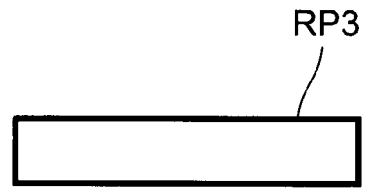
FIG. 15 is a diagram showing one reference pattern forming the composite pattern shown in FIG. 14.
Figure 16:
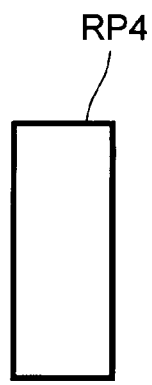
FIG. 16 is a diagram showing another reference pattern forming the composite pattern shown in FIG. 14.
Figure 17:
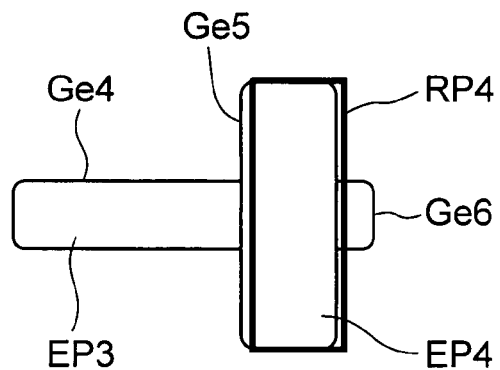
FIG. 17 is a diagram showing the result of matching the reference pattern shown in FIG. 16 with the inspection image shown in FIG. 14.

A composite pattern CP2 shown in an inspection image in FIG. 14 is constituted of two element patterns EP3 and EP4 perpendicularly intersecting with each other. An edge is detected from the inspection image of the composite pattern CP2, and then edge groups are generated by grouping. In the present example, three edge groups Ge4, Ge5 and Ge6 are generated. FIGS. 15 and 16 show reference patterns RP3 and RP4 of the element patterns EP3 and EP4 in FIG. 14. For example, the result of matching the reference pattern RP4 in FIG. 16 with the inspection image in FIG. 14 is shown in FIG. 17. It is understood from FIG. 17 that a matching position has deviated to the right in the drawing due to the influence of the group Ge6. In this state, a distance between the reference pattern RP4 and the edge group Ge4, a distance between the reference pattern RP4 and the edge group Ge5, and a distance between the reference pattern RP4 and the edge group Ge6 are calculated. It can be said that the influence on the matching is greater if a calculated value is lower. In the present example, the influences from the edge groups Ge4 and Ge6 are small.

Figure 18:
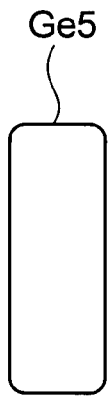
FIG. 18 is a diagram showing the result of eliminating the edge groups with low influence from a matching target by use of a threshold value.
Figure 19:
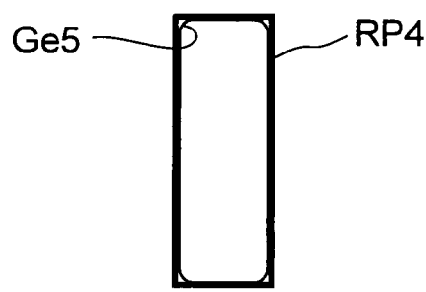
FIG. 19 is a diagram showing the result of using a method of judging the level of importance in association with the magnitude of distance in the distance field.

Thus, a preset threshold value can be used to eliminate the edge groups Ge4 and Ge6 as targets for matching. The result of eliminating the edge groups Ge4 and Ge6 in this manner is shown in FIG. 18. Further, if FIG. 18 is again matched with FIG. 16, a more accurate matching result can be obtained as shown in FIG. 19. The same procedure is carried out for the matching of the reference pattern RP3 in FIG. 15 with the inspection image in FIG. 14, and the result can be used to measure the misalignment of the element patterns EP3 and EP4 in FIG. 14.

(3) Program

A series of procedures of the pattern misalignment measurement method in the embodiments described above may be incorporated in a, program to be executed by a computer, contained in a recording medium such as a flexible disk or a CD-ROM, and read into and executed by the computer. This makes it possible to achieve the pattern misalignment measurement method according to the present invention by use of a general-purpose computer capable of image processing. The recording medium is not limited to a portable medium such as a magnetic disk or an optical disk, and may be a fixed recording medium such as a hard disk drive or a memory. Further, the program incorporating the series of procedures of the pattern misalignment measurement method described above may be distributed via a communication line (including wireless communication) such as the Internet. Moreover, the program incorporating the series of procedures of the pattern misalignment measurement method described above may be distributed in an encrypted, modulated or compressed state via a wired line such as the Internet or a wireless line or in a manner contained in a recording medium.

(4) Semiconductor Device Manufacturing Method

When the pattern misalignment measurement method described above is used in a process of manufacturing a semiconductor device, the misalignment of patterns can be measured with high accuracy and in a short time, such that the semiconductor devices can be manufactured with high yield and throughput.

More specifically, a semiconductor substrate is extracted per production lot, and a misalignment between element patterns superposed on each other on the extracted semiconductor substrate is measured by the pattern misalignment measurement method described above. When the semiconductor substrate exceeds a threshold value set in accordance with the product specifications and is judged as a nondefective product as a result of the measurement, the rest of the manufacturing process is continuously executed for the whole production lot to which the measured semiconductor substrate belongs. On the other hand, when the semiconductor substrate is judged as a defective product as a result of the measurement but can be reworked, rework processing is executed for the production lot to which the semiconductor substrate judged as the defective product belongs. When the rework processing is finished, the semiconductor substrate is extracted from the production lot, and misalignment is again measured. If the extracted semiconductor substrate is judged as a nondefective product as a result of the remeasurement, the rest of the manufacturing process is executed for the production lot finished with the rework processing. In addition, when the rework processing is impossible, the production lot to which the semiconductor substrate judged as the defective product belongs is disposed of. When the cause of the defect can be analyzed, results of the analysis are fed back to a person in charge of designing, a person in charge of an upstream process or the like.

While the embodiments of the present invention have been described above, the present invention is not limited to the embodiments described above, and can be modified in various manners within the technical scope thereof and carried out. For example, the whole edge within the inspection image is detected in the embodiments described above, but the present invention is not limited to this. An edge corresponding to the single-layer pattern EP1 and an edge corresponding to the single-layer pattern EP2 may be sequentially acquired in a selective manner, and each of the acquired single-layer patterns may be matched with the reference image.

What is claimed is:

1. A pattern misalignment measurement method comprising:
one or more computers implementing the following steps:
acquiring an inspection image of a composite pattern formed by superposing a plurality of element patterns, at least two of the element patterns being different;
acquiring reference images of the at least two element patterns;
performing first matchings of each of the at least two of the element patterns using the reference images and the inspection image, the first matchings including calculating pixel coordinates of matching positions by matching the reference images and the inspection image; and
determining a distance in pixels between edges of the reference images and corresponding edge points in the inspection image using the calculated pixel coordinates of the matching positions.

2. The pattern misalignment measurement method according to claim 1, further comprising:
outputting the magnitude of the influence of first edge points within the inspection image onto a distance field as importance, in accordance with the result of the first matching;
classifying the first edge points by use of a threshold value regarding the importance;
erasing the second edge points classified as low in the importance from the first edge points; and
performing a second matching between the first edge points, without the second edge points, and the corresponding reference images, respectively.

3. The pattern misalignment measurement method according to claim 1, further comprising:
generating edge groups from an edge of the inspection image by grouping;
outputting the magnitude of the influence of edge groups onto a distance field as importance, in accordance with the result of the first matching;
classifying the edge groups by use of a threshold value regarding the importance;
erasing the edge groups classified as low in the importance from the edge groups of the inspection image; and
performing a second matching between the edge groups within the inspection image, without the erased edge groups, and the corresponding reference images, respectively.

4. The pattern misalignment measurement method according to claim 3, further comprising determining a second distance from an edge of at least one of the at least two reference patterns to an edge point in the inspection image in accordance with the result of the first matching, wherein the importance is a numerical value corresponding to the second distance.

5. The pattern misalignment measurement method according to claim 1, wherein the composite pattern is a stack formed on a semiconductor substrate, and the plurality of element patterns are single-layer patterns constituting the stack.

6. A non-transitory computer readable recording medium containing a program which causes a computer to execute a pattern misalignment measurement, the misalignment measurement comprising:
acquiring an inspection image of a composite pattern formed by superposing a plurality of element patterns, at least two of the element patterns being different;
acquiring reference images of the at least two element patterns;

performing first matchings of each of the at least two of the element patterns using the reference images and the inspection image, the first matchings including calculating pixel coordinates of the matching positions by matching the reference images and the inspection image; and determining a first distance in pixels between edges of the reference images and corresponding edge points in the inspection image using the calculated pixel coordinates of the matching positions.

7. The non-transitory computer readable recording medium according to claim 6, wherein the pattern misalignment measurement further comprises:

outputting the magnitude of the influence of first edge points within the inspection image onto a distance field as importance, in accordance with the result of the first matching;

classifying the first edge points by use of a threshold value regarding the importance;

erasing second edge points classified as low in the importance from the first edge points; and performing a second matching between the first edge without the second edge points, and the corresponding reference images, respectively.

8. The non-transitory computer readable recording medium according to claim 7, wherein the pattern misalignment measurement method further comprises determining a second distance from an edge of at least one of the at least two reference patterns to an edge point in the inspection image in accordance with the result of the first matching, and the importance is a numerical value corresponding to the second distance from the edges of the reference pattern.

9. The non-transitory computer readable recording medium according to claim 6, wherein the pattern misalignment measurement method further comprises:

generating edge groups from an edge of the inspection image by grouping;

outputting the magnitude of the influence of edge groups a distance field as importance, in accordance with the result of the first matching;

classifying the edge groups by use of a threshold value regarding the importance;

erasing low importance edge groups from the edge groups of the inspection image; and performing a second matching between the edge groups within the inspection image, without the low importance edge groups, and the corresponding reference images, respectively.

10. The non-transitory computer readable recording medium according to claim 9, wherein the pattern misalignment measurement further comprises determining a second distance from an edge of at least one of the at least two reference pattern patterns to an edge point in the inspection image in accordance with the result of the first matching, and the importance is a numerical value corresponding to the second distance.

11. A semiconductor device manufacturing method comprising executing a process of manufacturing a semiconductor device on a semiconductor substrate judged as nondefective by measuring misalignment of patterns formed on the semiconductor substrate, a method of measuring the misalignment comprising:

one or more computers implementing the following steps:

acquiring an inspection image of a composite pattern formed by superposing a plurality of element patterns, at least two of the element patterns being different;

acquiring reference images of the at least two element patterns;

performing first matchings between the at least two element patterns using the reference images and the inspection image, the first matchings including calculating pixel coordinates of matching positions by matching the reference images and the inspection image; and determining a first distance in pixels between edges of the reference images and corresponding edge points in the inspection image using the calculated pixel coordinates of the matching positions.

12. The semiconductor device manufacturing method according to claim 11, wherein the pattern misalignment measurement method further comprises:

outputting the magnitude of the influence of first edge points onto a distance field as importance, in accordance with the result of the first matching;

classifying the first edge points by use of a threshold value regarding the importance;

erasing the second edge points classified as low in the importance from the first edge points within the inspection image; and performing a second matching between the first edge points, without the second edge points, and the corresponding reference images, respectively.

13. The semiconductor device manufacturing method according to claim 12, wherein the pattern misalignment measurement method further comprises determining a second distance from an edge of at least one of the at least two reference patterns to an edge point in the inspection image in accordance with the result of the first matching, and the importance is a numerical value corresponding to the second distance.

14. The semiconductor device manufacturing method according to claim 11, wherein the pattern misalignment measurement method further comprises:

generating edge groups from an edge of the inspection image by grouping;

outputting the magnitude of the influence of edge groups onto a distance field as importance, in accordance with the result of the first matching;

classifying the edge groups by use of a threshold value regarding the importance;

erasing the edge groups classified as low in the importance from the edge groups of the inspection image; and performing a second matchings between the edge groups within the inspection image, without the erased edge groups, and the corresponding reference images, respectively.

15. The semiconductor device manufacturing method according to claim 14, wherein the pattern misalignment measurement method further comprises determining a second distance from an edge of at least one of the at least two reference patterns to an edge point in the inspection image in accordance with the result of the first matching, and the importance is a numerical value corresponding to the second distance.

16. The semiconductor device manufacturing method according to claim 11, wherein the composite pattern is a stack formed on a semiconductor substrate, and the plurality of element patterns are single-layer patterns constituting the stack.

17. A pattern misalignment method comprising:
  one or more computers implementing the following steps:
    acquiring an inspection image of a composite pattern formed by superposing a plurality of element patterns, at least two of the element patterns being different;
    acquiring reference images of the at least two element patterns;
    performing first matchings between the reference images and the inspection image, the first matchings including calculating pixel coordinates of matching positions by matching the reference images and the inspection image;
    specifying edge points or edge group within the inspection image whose influence on the first matchings is relatively strong in all the edge points or in all the edge group by use of the result of the first matching;
    performing a second matching between the specified edge points or the specified edge group and the corresponding reference images, respectively; and
    determining a distance consistent with the first and second matchings in pixels between edges of the reference images and corresponding edge points in the inspection image using the calculated pixel coordinates of the matching positions.

18. A non-transitory computer readable recording medium containing a program which causes a computer to execute a pattern misalignment measurement, the misalignment measurement comprising:
  acquiring an inspection image of a composite pattern formed by superposing a plurality of element patterns, at least two of the element patterns being different;
  acquiring reference images of the at least two element patterns;
  performing first matchings between the reference images and the inspection image, the first matchings including calculating pixel coordinates of matching positions by matching the reference images and the inspection image;
  specifying edge points or edge group within the inspection image whose influence on the first matchings is relatively strong in all the edge points or in all the edge group by use of the result of the first matching;
  performing a second matching between the specified edge points or the specified edge group and the corresponding reference images, respectively; and
  determining a distance consistent with the first and second matchings in pixels between edges of the reference images and corresponding edge points in the inspection image using the calculated pixel coordinates of the matching positions.

* * * * *